(12) United States Patent
DeBonis (10) Patent No.: US 7,880,124 B2
(45) Date of Patent: Feb. 1, 2011

(54) ASSEMBLY PACKAGING USING INDUCTION HEATING

(75) Inventor: Thomas Joseph DeBonis, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 489 days.

(21) Appl. No.: 11/599,529

(22) Filed: Nov. 13, 2006

(65) Prior Publication Data

US 2007/0084856 A1   Apr. 19, 2007

Related U.S. Application Data

(62) Division of application No. 10/876,512, filed on Jun. 24, 2004, now Pat. No. 7,161,122.

(51) Int. Cl.
 *H05B 6/40* (2006.01)
 *B23K 1/00* (2006.01)
(52) U.S. Cl. .................. 219/603; 219/605; 219/656; 219/635; 228/179.1
(58) Field of Classification Search ............... 219/603, 219/605, 615, 616, 635, 656, 661; 228/178–180.5; 29/840–860; 438/106–127
See application file for complete search history.

*Primary Examiner*—Quang T Van
(74) *Attorney, Agent, or Firm*—Blakely, Sokoloff, Taylor & Zafman LLP (57) ABSTRACT

An embodiment of the present invention is a technique to package a device. Heat is localized on a die having bumps on a package substrate using a first induction heater operating at a first frequency. Heat is localized on at least an integrated heat spreader (IHS), a thermal interface material (TIM), an underfill, and a sealant on the die using a second induction heater operating at a second frequency.

17 Claims, 7 Drawing Sheets

FIG. 5

ASSEMBLY PACKAGING USING INDUCTION HEATING

CROSS-REFERENCES TO RELATED APPLICATIONS

This is a Divisional Application of U.S. patent application Ser. No. 10/876,512, filed Jun. 24, 2004 now U.S. Pat. No. 7,161,122. This Divisional Application claims the benefit of the U.S. patent application Ser. No. 10/876,512.

BACKGROUND

1. Field of the Invention

Embodiments of the invention relate to the field of semiconductors, and more specifically, to device packaging.

2. Description of the Related Art

Thermal design is critical during device packaging. As operating frequencies and power dissipation increase, device packaging focuses more and more on efficient ways to transfer heat from the semiconductor junctions to the environment. One of the common methods to provide heat transfer is the use of an integrated heat spreader (IHS) as part of the device package.

Existing techniques to address the problem of thermal design during device packaging have a number of disadvantages. Typically, the die and package substrate are heated at an elevated temperature in an oven and then cooled. Due to mismatch in coefficients of thermal expansion (CTEs) between the die and the substrate, warping may occur resulting in a reduction in co-planarity. During IHS attachment, spring clip tension is applied to the IHS in a convection oven to maintain control of bond line thickness (BLT). The repeated thermal cycling of the clips and the number of spring clips required in a high volume manufacturing (HVM) factory with many hours of work in process (WIP) leads to inefficient and costly packaging assembly.

BRIEF DESCRIPTION OF THE DRAWINGS

Embodiments of the invention may best be understood by referring to the following description and accompanying drawings that are used to illustrate embodiments of the invention. In the drawings.

DESCRIPTION

An embodiment of the present invention is a technique to package a device. Heat is localized on a die having bumps on a package substrate using a first induction heater operating at a first frequency. Heat is localized on at least an integrated heat spreader (IHS), a thermal interface material (TIM), an underfill, and a sealant on the die using a second induction heater operating at a second frequency.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, a method of manufacturing or fabrication, etc.

One embodiment of the invention addresses the problems caused by the differences or mismatches between the coefficients of thermal expansion (CTEs) of the silicon die and the package substrate. These problems include stress, poor coplanarity, and warping of the component. Additionally, one embodiment of the invention reduces the time-temperature exposure of the die and the package; thereby reducing undesired reactions, particularly with the Controlled Collapse Chip Connection (C4) joints. Reducing these undesired reactions leads to increased reliability of the C4 joints and other interfaces in the die and package.

The advantages of one embodiment of the invention include at least: (1) improved process control and reduction of tooling costs because the entire assembly process can be performed on individual packages with single-unit handling capability, (2) improved throughput time (TPT), (3) significant reduction of CTE mismatches between die and package substrate, (4) reduction of tool footprint thanks to small induction heating coils, (5) efficient heating due to induction heating leading to reduction of total thermal budget that the device and package is exposed to.

Figure 1:
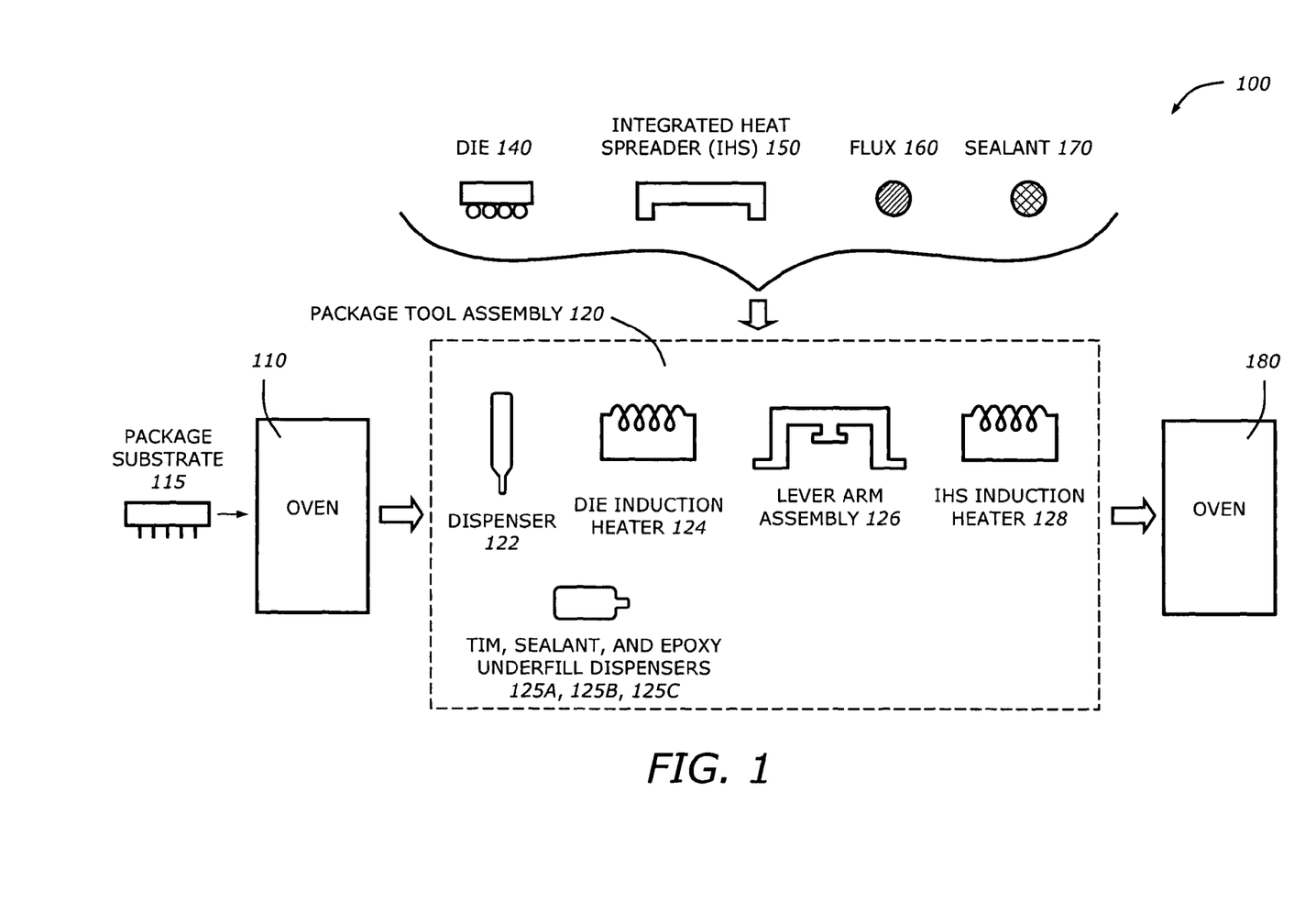
FIG. 1 is a diagram illustrating a packaging system in which one embodiment of the invention can be practiced.

FIG. 1 is a diagram illustrating a packaging system 100 in which one embodiment of the invention can be practiced. The packaging system 100 represents an assembly flow or process to package semiconductor devices. It includes an oven 110, a package tool assembly 120, and a burn-in or cure oven 180. As is known by one skilled in the art, the packaging system may include more or less than these components.

The oven 110 bakes a package substrate 115 to prepare it for the assembly process. The package substrate 115 may be moisture absorbent and therefore may be dried to eliminate the absorbed moisture. The baking temperature and time depend on the type of material and the condition of the substrate. In one embodiment, the bake time is 24 hours and the baking temperature is 125° C.

The package tool assembly 120 includes a number of tools to place various components onto the package substrate 115. These tools include various dispensers or pumps to dispense or deposit flux, epoxy, or sealant, pick and place tool, etc. In one embodiment, the package tool assembly 120 includes a dispenser 122, a TIM dispenser 125A, a sealant dispenser 125B, an epoxy underfill dispenser 125C, a die induction heater 124, a lever arm assembly 126, and an IHS induction heater 128. These tools are used to place and process components such as a die 140, an integrated heat spreader (IHS) 150, a flux 160, a sealant 170, and an epoxy underfill 175.

The oven 180 is used mainly to cure the glue or polymer-type TIM, sealant, epoxy underfill and other interface materials in the package. It may also be used to burn in the packaged device for early failures.

The entire assembly process can be performed using the packaging system 100 through several phases or stages. The package tool assembly 120 may be used in one single unit station or several stations. These phases or stages are illustrated in FIGS. 2A through 2G.

Figure 2A:
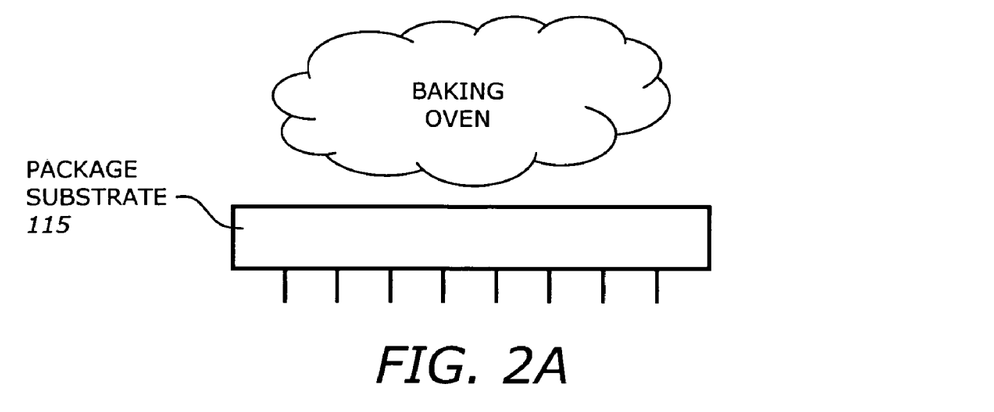
FIG. 2A is a diagram illustrating baking a package substrate according to one embodiment of the invention.

FIG. 2A is a diagram illustrating baking a package substrate according to one embodiment of the invention. The package substrate 115 is any suitable substrate for packaging. It may be a ceramic substrate or an organic substrate. The package substrate 115 has interconnecting elements to attach the device to a printed circuit board (PCB). Any suitable device packaging technique may be used including Ball Grid Array (BGA), Pin Grid Array (PGA), flip chip technology, etc. The package substrate 115 is placed in the oven 110 (FIG. 1) at an elevated temperature (e.g., 125° C.) over an extended period of time (e.g., 24 hours) to remove any moisture.

Figure 2B:
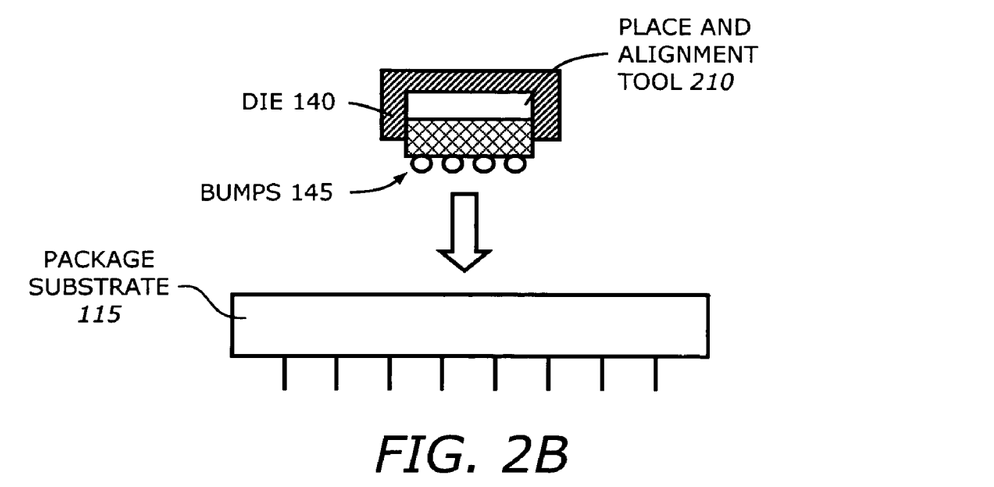
FIG. 2B is a diagram illustrating placing die on the package substrate according to one embodiment of the invention.

FIG. 2B is a diagram illustrating placing die on the package substrate according to one embodiment of the invention. The die 140 (FIG. 1) has a number of bumps 145 deposited on the lower surface. In one embodiment, the bumps 145 are Controlled Collapse Chip Connection (C4) bumps. The dispenser 122 may be used to dispense flux onto the bump locations. A place and alignment tool 210 is used to pick the die 140, position it above the package substrate 115, align it at a proper location, and place it on the package substrate 115. Typically, the location is at the center of the package substrate 115.

Figure 2C:
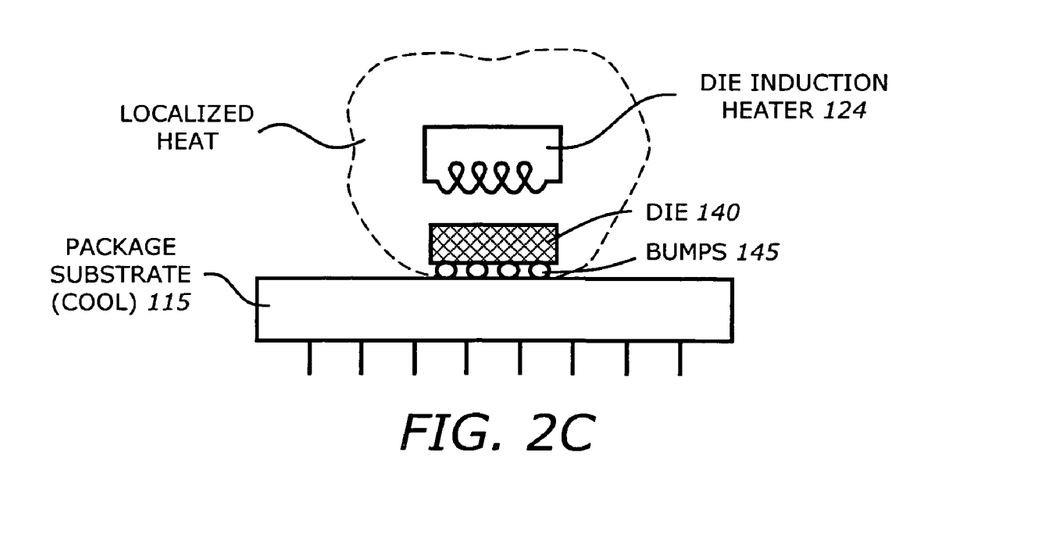
FIG. 2C is a diagram illustrating localizing heat on the die according to one embodiment of the invention.

FIG. 2C is a diagram illustrating localizing heat on the die according to one embodiment of the invention. The die induction heater 124 is placed above and near the upper surface of the die 140. The die induction heater 124 is a device that provides fast and efficient heating using induction. It typically includes an alternating current (AC) power supply and an induction coil. When it is energized by the AC power supply, the alternating current is sent through the induction coil, generating a magnetic field. When it is placed above the die 140 and the bumps 145, the magnetic field induces eddy currents in the die 140 and the bumps 145 and generates a localized heat.

The heat penetration into the die 140 and the bumps 145 provided by the die induction heater 124 is a function of the operating frequency. For a die size of approximately 10 mm or 1 cm, an operating frequency between 1 KHz to 10 KHz may be sufficient to achieve satisfactory penetration depth. It is contemplated that the operating frequency may be higher for smaller sizes, and may be between 100 KHz to 400 KHz. The heating time may be within a few seconds to less than a minute. This time exposure is much faster than traditional heating techniques and therefore provides very efficient and cost effective assembly process. In addition, the size of the induction coil typically is approximately the same as the size of the die 140; therefore the assembly tool requires small footprint or space, leading to reduced costs. More importantly, the heating is carried out locally within the die 140 and the bumps 145. The package substrate 115 remains essentially thermally isolated from the die 140 and the bumps 145.

It remains cool throughout the local induction heating of the die 140 and the bumps 145. Stress and other problems caused by CTE mismatch may be reduced or eliminated resulting in high reliability of the C4 solder joints. After induction heating, the C4 solder joints are formed and the die 140 is attached to the package substrate 115.

Figure 2D:
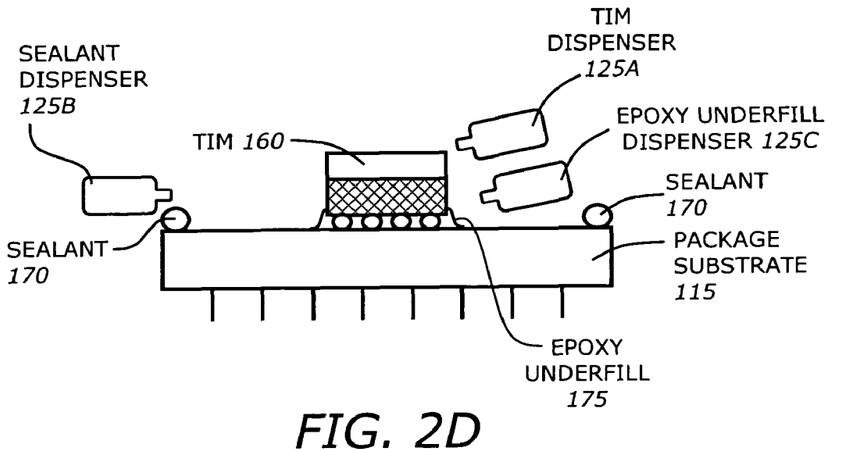
FIG. 2D is a diagram illustrating dispensing thermal interface material and sealant according to one embodiment of the invention.

FIG. 2D is a diagram illustrating dispensing thermal interface material and sealant according to one embodiment of the invention. The TIM dispenser 125A dispenses the flux 160 (FIG. 1) as the thermal interface material on the upper surface of the die 140. The TIM 160 may be any suitable material such as grease or grease-like material filled with conductive particles, adhesive, phase change material, gel, or solders. When a solder-type TIM is used, it reflows during the IHS local heating as explained in FIG. 2F. The sealant dispenser 125B dispenses the sealant 170 on the package substrate 115, typically at its edge or periphery. The underfill dispenser 125C dispenses the epoxy underfill 175.

Figure 2E:
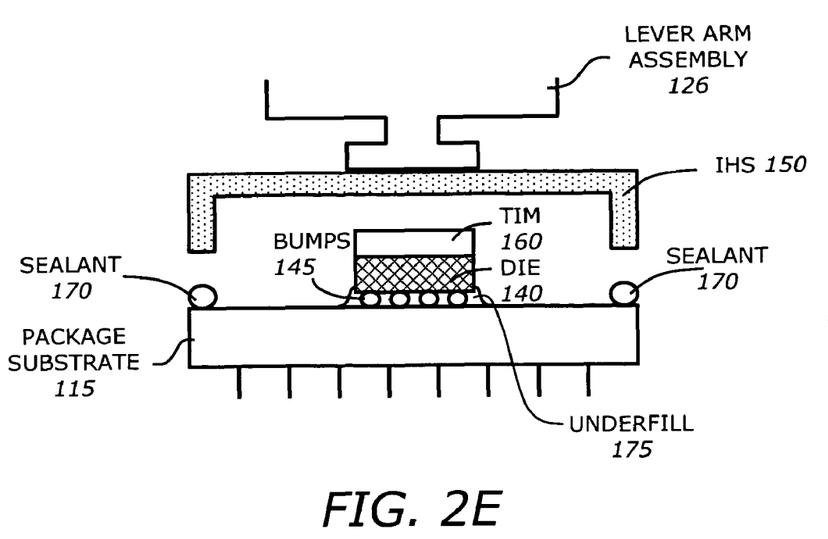
FIG. 2E is a diagram illustrating placing an integrated heat spreader (IHS) on the die according to one embodiment of the invention.

FIG. 2E is a diagram illustrating placing an integrated heat spreader (IHS) on the die according to one embodiment of the invention. The IHS 150 may be made by a thermally conductive material such as aluminum, plated copper, copper alloy, ceramic, or carbon composites. The IHS 150 is positioned to align with the package substrate 115 and placed on the package substrate at the periphery and the TIM 160 on the die 140. The lever arm assembly 126 applies a force on the IHS 150 to maintain a desired bond line thickness (BLT) between the lower IHS surface and the die upper surface.

Figure 2F:
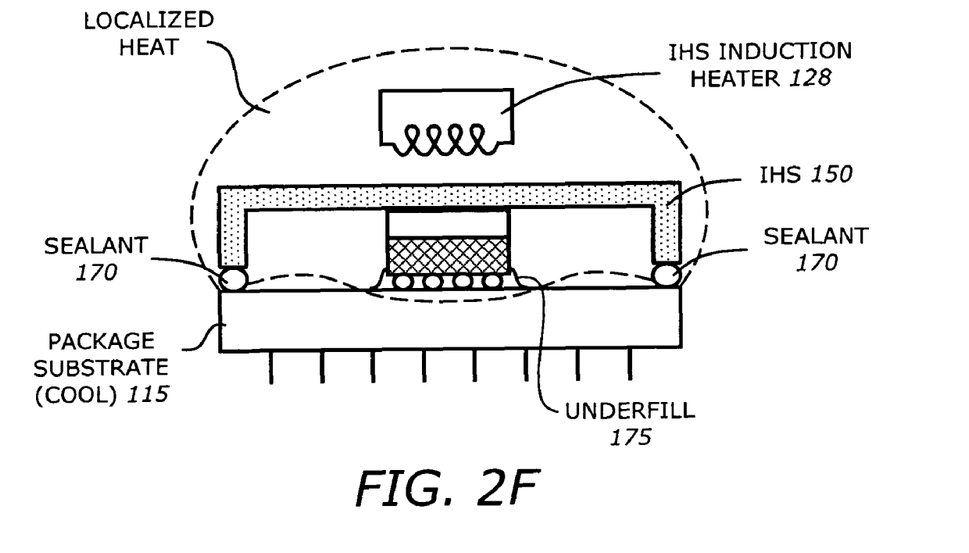
FIG. 2F is a diagram illustrating localizing heat on the IHS according to one embodiment of the invention.

FIG. 2F is a diagram illustrating localizing heat on the IHS according to one embodiment of the invention. The IHS induction heater 128 (FIG. 1) is placed above the IHS 150 to localize the heat on the IHS, the TIM 160 and the sealant 170. The IHS induction heater 128 operates in the same manner as the die induction heater 124. It may be the same as the die induction heater 124. In other words, the same induction heater can be used as the die induction heater 124 and the IHS induction heater 128 with same or different operating frequencies. It may be a different induction heater than the die induction heater 124, having different induction coil, and operating at a different frequency. As with the die induction heater 124, the heating time is a function of the type of induction heater used and the operating frequency. Typically, the heating time is approximately equal to one minute and the operating frequency ranges from 1 KHz to 10 KHz. The local heating may also cure the TIM 160 if a solder-type TIM is used because it does not require a long cure time. The solder-type TIM may be melted and alloyed during this second induction heating.

Since the heating is carried out locally within the IHS 150, the TIM 160, and the sealant 170, the package substrate 115 and the die 140 remain cool or thermally isolated. Therefore, problems caused by CTE mismatches between the package substrate 115 and the die 140 are avoided or reduced. For example, if the CTE of the die is 3 ppm/° C., the CTE of the IHS is 6 ppm/° C., and the CTE of the substrate is 16 ppm/° C., the CTE mismatch is 6 ppm/° C.−3 ppm/° C.=3 ppm/° C. instead of close to 16 ppm/° C.−6 ppm/C.=10 ppm/° C. if both the substrate 115 and the IHS 150 are heated together.

Figure 2G:
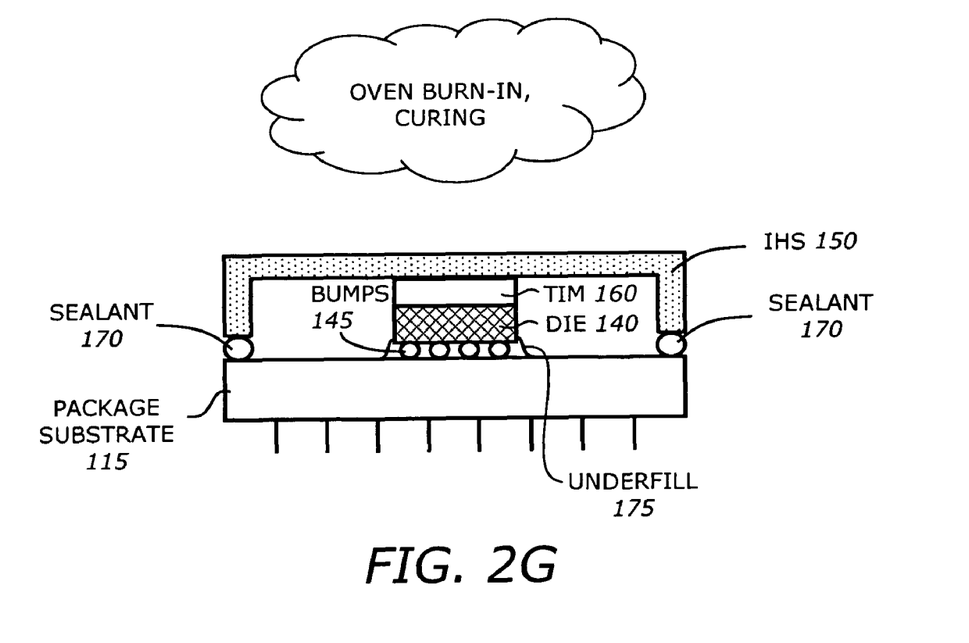
FIG. 2G is a diagram illustrating curing the thermal interface material and sealant according to one embodiment of the invention.

FIG. 2G is a diagram illustrating curing the thermal interface material and sealant according to one embodiment of the invention. The packaged device including the IHS 150 sealed to the substrate 115 and encasing the die 140 is placed in the burn-in oven 180 (FIG. 1) to cure the TIM 160 (other than solder-type TIM) and the sealant 170. As discussed earlier, if the TIM 160 is a solder-type TIM, the oven curing is not needed. The die 140 and the package substrate 115 are held relative rigid because the IHS 150 and burn-in socket are in place. This reduces the package warping and improves co-planarity and pin true position. In addition, this permits the epoxy to cure at approximately the device operating temperature for minimum stress.

Figure 3:
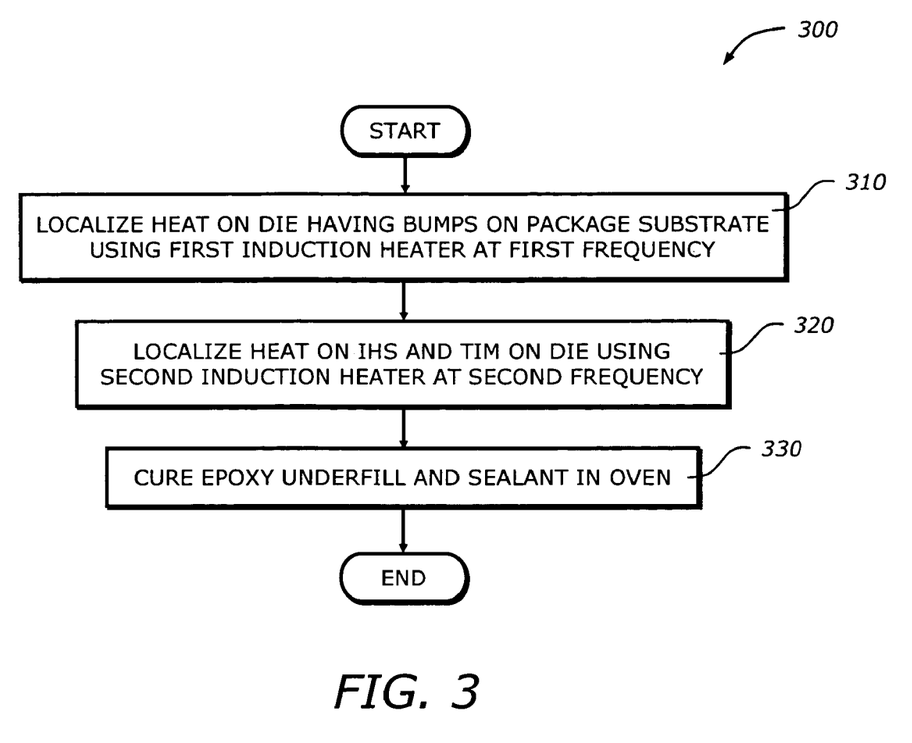
FIG. 3 is a flowchart illustrating a process to package a device using induction heating according to one embodiment of the invention.

FIG. 3 is a flowchart illustrating a process 300 to package a device using induction heating according to one embodiment of the invention.

Upon START, the process 300 localizes heat on a die having bumps on a package substrate using a die induction heater operating at a first frequency (Block 310). Then, the process 300 localizes heat on at least an IHS, TIM on the die, an underfill, and a sealant using an IHS induction heater operating at a second frequency (Block 320). Next, the process 300 cures the TIM (other than solder-type TIM) and sealant in an oven (Block 330) The curing of the TIM and sealant can be done in a burn-in oven while the devices are being burned in. The process 300 is then terminated.

Figure 4:
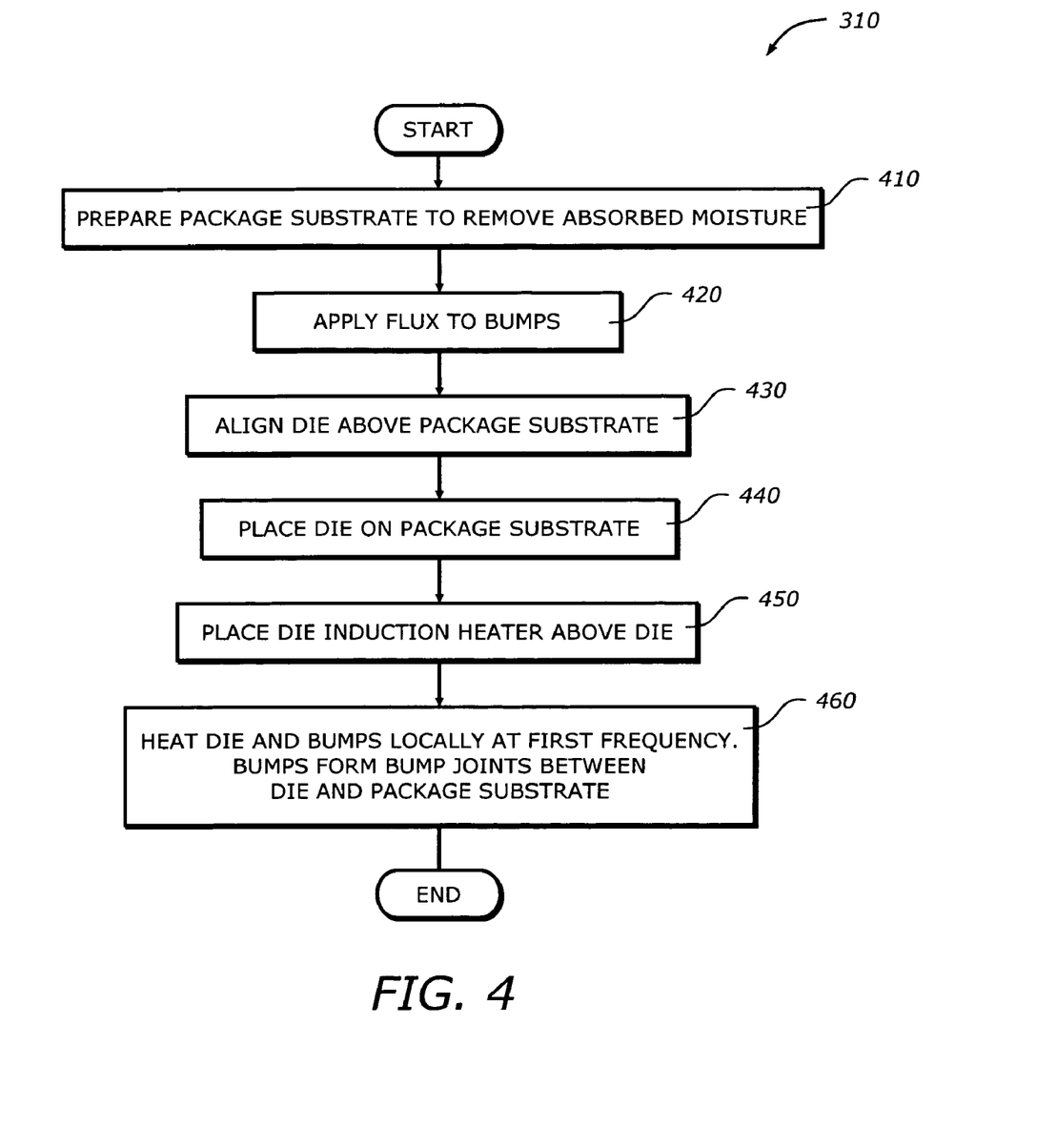
FIG. 4 is a flowchart illustrating a process to localize heating on the die according to one embodiment of the invention.

FIG. 4 is a flowchart illustrating the process 310 to localize heating on the die according to one embodiment of the invention.

Upon START, the process 310 prepares the package substrate to remove any absorbed moisture (Block 410). This can be done by baking the package substrate in an oven at an elevated temperature (e.g., 125° C.) for an extended period of time (e.g., 24 hours). Next, the process 310 applies flux to the bumps on the die (Block 420). Then, the process 310 aligns the die above the package substrate (Block 430) and places the die on the package substrate (Block 440).

Next, the process 310 places the die induction heater above the die (Block 450). Then, the process 310 heats the die and bumps locally through the generated magnetic field (Block 460). The bumps then form bump joints between the die and the package substrate. The process 310 is then terminated.

Figure 5:
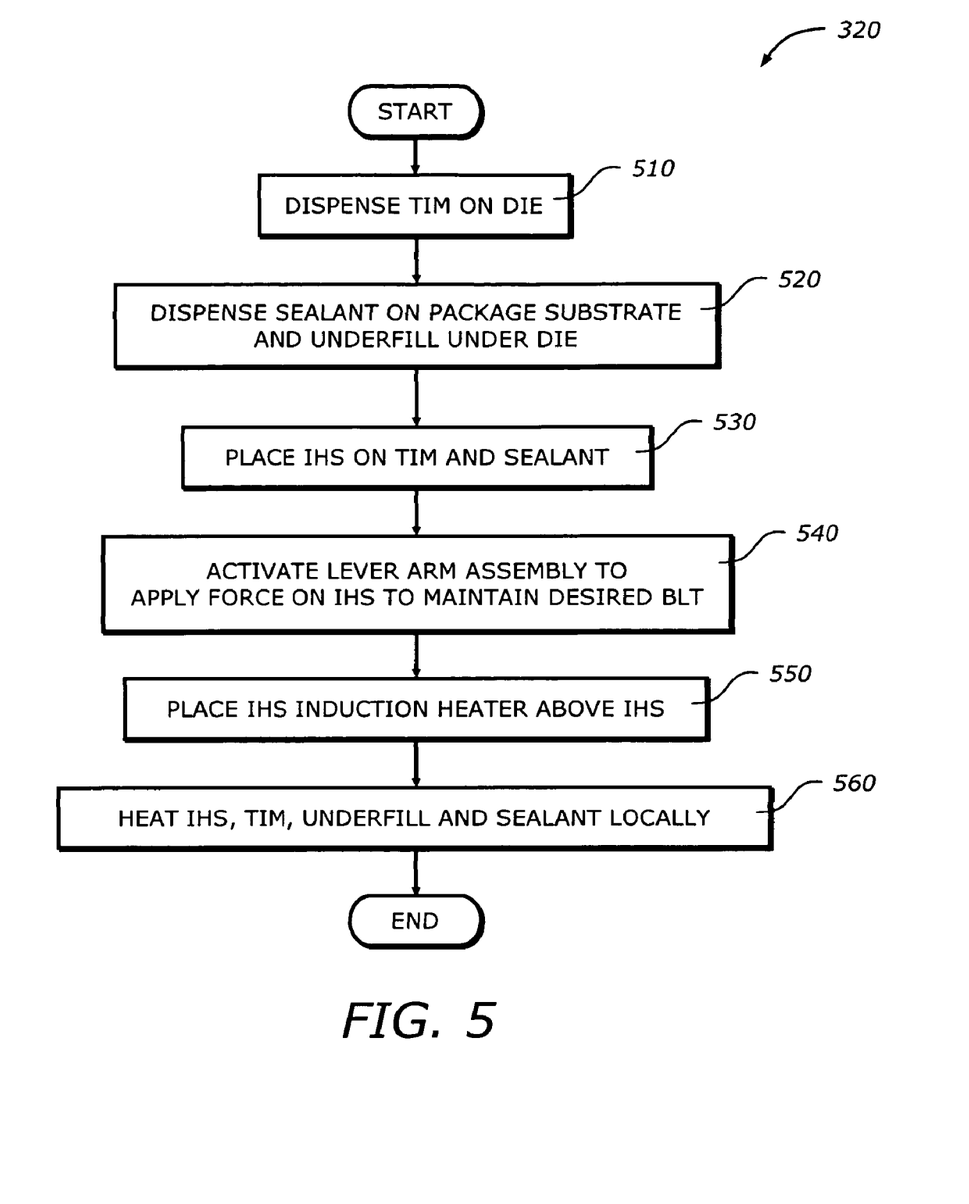
FIG. 5 is a flowchart illustrating a process to localize heating on the IHS according to one embodiment of the invention.

FIG. 5 is a flowchart illustrating the process 320 to localize heating on the IHS according to one embodiment of the invention.

Upon START, the process 320 dispenses the TIM on the die (Block 510). Then, the process 320 dispenses the sealant on the package substrate and underfill under the die (Block 520). Next, the process 320 places the IHS on the TIM and the sealant (Block 530). Then, the process 320 activates a lever arm mechanism to apply force on the IHS to maintain the desired BLT (Block 540).

Next, the process 320 places an IHS induction heater above the IHS (Block 550). Then, the process 320 heats the IHS, the TIM, the underfill, and the sealant locally (Block 560). As noted earlier, if the TIM is a solder-type TIM, this local heating also cures the TIM. The process 320 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A packaging tool assembly comprising:
a first induction heater having an induction coil to locally heat a die having bumps on a package substrate at a first frequency, the package substrate being thermally isolated from the die and the bumps, the induction coil having a size within the package substrate; and
a second induction heater to locally heat at least one of an integrated heat spreader IHS, a thermal interface material (TIM) on the die, an underfill, and a sealant on the package substrate at a second frequency.

2. The packaging tool assembly of claim 1 further comprising:
a first dispenser to dispense the TIM on the die; and
a second dispenser to dispense the sealant on the package substrate.

3. The packaging tool assembly of claim 2 further comprising a third dispenser to dispense the underfill under the die.

4. The packaging tool assembly of claim 1 further comprising:
a lever arm assembly to apply force on the IHS and the TIM to maintain a desired bond line thickness (BLT) between lower IHS surface and die surface.

5. The packaging tool assembly of claim 1 wherein the first and second induction heaters are same.

6. The packaging tool assembly of claim 1 wherein the first and second frequencies are approximately equal.

7. The packaging tool assembly of claim 1 wherein at least one of the first and second frequencies is between 1 KHz to 10 KHz.

8. The packaging tool assembly of claim 1 wherein at least one of the first and second induction heaters has a size approximately similar to size of the die.

9. The packaging tool assembly of claim 1 wherein the bumps are Controlled Collapse Chip Connection (C4).

10. A packaging system comprising:
a first oven to bake a package substrate; and
a packaging tool assembly to package a die on the package substrate, the package tool assembly comprising:
a first induction heater having an induction coil to locally heat a die having bumps on a package substrate at a first frequency, the package substrate being thermally isolated from the die and the bumps, the induction coil having a size within the package substrate, and
a second induction heater to locally heat at least one of an integrated heat spreader IHS, a thermal interface material (TIM) on the die, an underfill, and a sealant on the package substrate at a second frequency.

11. The packaging system of claim 10 wherein the packaging tool assembly further comprises:
a first dispenser to dispense the TIM on the die; and
a second dispenser to dispense the sealant on the package substrate.

12. The packaging system of claim 11 wherein the packaging tool assembly further comprises:
a third dispenser to dispense the underfill under the die.

13. The packaging system of claim 10 wherein the packaging tool assembly further comprises:
a lever arm assembly to apply force on the IHS and the TIM to maintain a desired bond line thickness (BLT) between lower IHS surface and die surface.

14. The packaging system of claim 10 wherein the first and second induction heaters are same.

15. The packaging system of claim 10 wherein the first and second frequencies are approximately equal.

16. The packaging system of claim 10 wherein at least one of the first and second frequencies is between 1 KHz to 10 KHz.

17. The packaging system of claim 10 further comprising:
a second oven to cure at least one of the TIM and the sealant.

* * * * *